(12) United States Patent
Tomine (10) Patent No.: US 7,885,728 B2
(45) Date of Patent: *Feb. 8, 2011

(54) METHOD AND SYSTEM FOR CONTROLLING SEMICONDUCTOR MANUFACTURING APPARATUS

(75) Inventor: Tetsu Tomine, Sakata (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/697,636

(22) Filed: Feb. 1, 2010

(65) Prior Publication Data

US 2010/0138076 A1   Jun. 3, 2010

Related U.S. Application Data

(63) Continuation of application No. 11/693,777, filed on Mar. 30, 2007, now Pat. No. 7,684,903.

(30) Foreign Application Priority Data

Apr. 3, 2006   (JP) .............................. 2006-101696

(51) Int. Cl.
*H01H 43/00* (2006.01)
(52) U.S. Cl. .................................... 700/306
(58) Field of Classification Search ................ 700/121, 700/173, 291, 296, 306
See application file for complete search history.

(56) References Cited

U.S. PATENT DOCUMENTS

| | | | |
|---|---|---|---|
| 6,356,804 B1 * | 3/2002 | Conboy et al. ............... | 700/228 |
| 6,937,917 B2 | 8/2005 | Akiyama et al. | |
| 6,986,261 B2 * | 1/2006 | Sasaki et al. ................... | 62/201 |
| 6,990,747 B2 * | 1/2006 | Kitoku et al. ................... | 34/92 |
| 7,201,851 B2 * | 4/2007 | Kitoku et al. .................. | 216/58 |
| 7,684,903 B2 * | 3/2010 | Tomine ...................... | 700/306 |
| 2006/0143706 A1 * | 6/2006 | Kawasaki et al. ............. | 726/19 |

FOREIGN PATENT DOCUMENTS

| | | |
|---|---|---|
| JP | 05-077144 | 3/1993 |
| JP | 11-057667 | 3/1999 |
| JP | 2000-260672 | 9/2000 |
| JP | 2002-120435 | 4/2002 |

* cited by examiner

*Primary Examiner*—Albert DeCady
*Assistant Examiner*—Chad Rapp
(74) *Attorney, Agent, or Firm*—Harness, Dickey & Pierce, P.L.C.

(57) ABSTRACT

A method for controlling a semiconductor manufacturing apparatus in a wait mode, including: obtaining information regarding a waiting time required for a product to arrive at the apparatus on a production line, the product being subjected to a predetermined process by the semiconductor manufacturing apparatus; obtaining information regarding a time required to control energy saving between lowering electric power and other energy used by the semiconductor manufacturing apparatus in the wait mode to a level at which the processing is not ready and raising the electric power and the other energy to a processable level at which the product processing is ready; and judging whether or not to execute the energy saving control of the semiconductor manufacturing apparatus based on results of comparison of the required time with the waiting time and of estimation on an effect of energy saving obtained by executing the energy saving control during the waiting time.

12 Claims, 9 Drawing Sheets

| DIVISION | COMPONENTS (UNITS) | | ENERGY | IN PROCESS | STANDBY-0 | STANDBY-1 | STANDBY-2 |
|---|---|---|---|---|---|---|---|
| PLASMA | RF POWER SOURCE | | | ○ | | | |
| | MAGNET POWER SOURCE | | | ○ | | | |
| | MATCHING BOX | | | ○ | ○ | | |
| TABLE | TABLE HEATING | | | ○ | | | |
| | HEAT EXCHANGER MEDIUM CIRCULATION PUMP | | COOLING WATER | ○ | ○ | ○ | ○ |
| CHAMBERS | PROCESS CHAMBER | TMP | POWER COOLING WATER | ○ ○ | ○ ○ | △ | △ |
| | | DRY PUMP | POWER COOLING WATER NITROGEN | ○ ○ ○ | ○ ○ ○ | △ △ △ | △ △ △ |
| | TRANSPORT CHAMBER | TMP | POWER COOLING WATER | ○ ○ | ○ ○ | △ △ | |
| | | DRY PUMP | POWER COOLING WATER NITROGEN | ○ ○ ○ | ○ ○ ○ | △ △ △ | △ △ △ |
| | CASSETTE CHAMBER | DRY PUMP | POWER COOLING WATER NITROGEN | ○ ○ ○ | ○ ○ ○ | | |

○ : ON
△ : INTERMITTENT OPERATION (OPERATES ON CONDITIONS)
NO MARK: STOPPED MODE

METHOD AND SYSTEM FOR CONTROLLING SEMICONDUCTOR MANUFACTURING APPARATUS

CROSS REFERENCE TO RELATED APPLICATIONS

This application is a continuation patent application of U.S. Ser. No. 11/693,777 filed Mar. 30, 2007, claiming priority to Japanese Patent Application 2006-101696, filed Apr. 3, 2006, all of which are hereby expressly incorporated by reference in their entirety.

BACKGROUND

1. Technical Field

The present invention relates to a method and system for controlling semiconductor manufacturing apparatuses, and particularly to a technique to reduce energy loss when the semiconductor manufacturing apparatuses are in a wait mode, without interfering with turnaround-time (TAT) reduction.

2. Related Art

A production line of semiconductor devices has a clean room that makes filtered clean air flow down and various manufacturing apparatuses arranged in the clean room. Examples of the apparatuses are: a thermal treatment apparatus that generates thermal diffusion of an impurity in a semiconductor wafer, a chemical-vapor deposition (CVD) apparatus that provides an insulating film, and a dry etching apparatus that etches an insulating film or a conductive film. Most of the apparatuses require not only electric power but also other energy such as evacuated air, cooling water, compresses air, vacuum, nitrogen ($N_2$), and released heat.

In related techniques, when the manufacturing apparatus is set in a wait mode between product processes, power supply from a radio-frequency (RF) power source and a magnetic power source is turned off to reduce the output of a heater to some extent so as to cut down on the energy use. The manufacturing apparatus stays in the wait mode at a level at which product processing is ready to start (i.e., a processable level) as soon as a product to be processed is provided to a loader of the manufacturing apparatus so as not to interfere with reduction in turnaround time (TAT).

JP-A-2000-260672 discloses another method to reduce power consumption that uses a manufacturing apparatus (e.g. a coaster developer) having a plurality of units to conduct different processes on a semiconductor wafer. The apparatus does not supply electric power to the units in the waiting mode.

JP-A-5-77144 is another example of the related art.

In general, a production line handles not one type of product but multiple types of products in small lots. Different product types require different product processes. Accordingly, some manufacturing apparatuses in a production line are frequently used, and others are not. Furthermore, the frequency of the use of manufacturing apparatuses generally varies depending on the product type, volume, and process timing on a production line.

Therefore, it is rare to keep the manufacturing apparatuses in non-stop operation between predetermined maintenance breaks. In many cases, the apparatuses are kept in the wait mode between processes. The waiting time between the processes may last only for several minutes, or it may last for as long as a couple of days.

However, in the related techniques, the manufacturing apparatuses making up a production line are each in a constant wait mode at a level at which the apparatus is ready to start the product processing regardless of the length of time to wait for the next product processing. Therefore, if the waiting time is long, there is a large loss of energy.

SUMMARY

An advantage of the invention is to provide a method and system for controlling semiconductor manufacturing apparatuses, and particularly to a technique to reduce energy loss when the semiconductor manufacturing apparatuses are in a wait mode, without interfering with turnaround-time (TAT) reduction.

According to a first aspect of the invention, a method for controlling a semiconductor manufacturing apparatus in a wait mode includes: obtaining information regarding a waiting time required for a product to arrive at the apparatus on a production line, the product being subjected to a predetermined process by the semiconductor manufacturing apparatus; obtaining information regarding a time required to control energy saving between lowering electric power and other energy used by the semiconductor manufacturing apparatus in the wait mode to a level at which the processing is not ready and raising the electric power and the other energy to a processable level at which the product processing is ready; and judging whether or not to execute the energy saving control of the semiconductor manufacturing apparatus based on results of comparison of the required time with the waiting time and of estimation on an effect of energy saving obtained by executing the energy saving control during the waiting time.

Examples of the "semiconductor manufacturing apparatus" include a dry etching apparatus, a CVD apparatus, and a thermal treatment apparatus. The apparatus receives the electric power and the other energy as consumption energy. Examples of the "product" include a semiconductor device formed on a wafer or a glass substrate. The "electric power and other energy in a wait mode" refers to the electric power and the other energy used by the semiconductor manufacturing apparatuses in the wait mode between production processes, for example. The "other energy" refers to energy other than the electric power, such as evacuated air, cooling water, compressed air, vacuum, nitrogen ($N_2$), and released heat. The "processable level" is a level at which processing is ready as soon as the product to be processed is provided to a loader of the manufacturing apparatus.

In the first aspect of the invention, the energy saving control may be executed only if the waiting time in the wait mode of the semiconductor manufacturing apparatus is longer than the time required for the energy saving control and if the energy consumption in the wait mode is estimated to decrease due to the execution of the energy saving control during the waiting time. Therefore, the energy loss in the wait mode of the apparatus may be reduced without interfering with the TAT reduction.

It is preferable that the judgment on whether or not to execute the energy saving include: executing the energy saving control if the required time is shorter than the waiting time and if it is estimated that an amount of energy consumption in a wait mode will decrease due to the execution of the energy control during the waiting time; and not executing the energy saving control if the required time is equal to or longer than the waiting time or if it is estimated that an amount of energy consumption in a wait mode will not decrease due to the execution of the energy control during the waiting time.

In the energy saving control of, e.g., the thermal treatment apparatus, the temperature of the furnace (reaction chamber) may be lowered and then returned to the original temperature after a predetermined period of time by heating inside the furnace. However, it requires energy to raise the once lowered temperature in the furnace to the original temperature. Therefore, if the step of maintaining the temperature inside the furnace of the energy saving control at a low temperature finishes in a short period of time, it is probable that the energy consumption even increases because of the energy saving control.

Therefore, in the method having this feature, it is possible to reduce the energy loss in the wait mode of the semiconductor manufacturing apparatus.

It is preferable that, in this method, the energy saving control include: lowering the electric power and the other energy used by the semiconductor manufacturing apparatus in the wait mode to the low energy level; maintaining the electric power and the other energy in the wait mode at the low energy level for a predetermined period of time; raising the electric power and the other energy from the low energy level to the processable level; and confirming a state of the semiconductor manufacturing apparatus after raising the level of the electric power and the other energy in the wait mode to the processable level.

In this case, because the semiconductor manufacturing apparatus is normally designed so that the processable level is maintained, it is possible that, once the electric power and the other power in the wait mode fall to the low energy level, the apparatus may not rise easily to the processable level thereafter. In other words, a change in the states of the semiconductor manufacturing apparatus may accompany a risk of having to recover the state of the apparatus.

The method having this feature allows detection of a problem that may (unexpectedly) occur to the semiconductor manufacturing apparatus caused by execution of the energy saving control.

It is preferable that the method further include: having several types of control patterns to be selected, each having a different required time and a different amount of energy consumption; the judgment on whether or not to execute the energy saving control including: comparing the waiting time and the required time for each of the several types of control patterns; estimating the effect of energy saving using a first specific pattern selected out of the several types of patterns, the first specific pattern being an only one pattern in which the required time is shorter than the waiting time; and estimating the effect of energy saving using a second specific pattern selected out of two or more specific patterns in which the required time is shorter than the waiting time, the second specific pattern being a most energy-saving pattern in the two or more specific patterns out of the several types of patterns.

This feature allows effective reduction of the energy loss in accordance with the length of the waiting time.

It is preferable that the method further include: obtaining information on a newest waiting time during execution of the energy saving control; and readjust the control pattern of the energy saving control in progress based on the information on the newest waiting time.

This feature allows flexible response to the fluctuation of the waiting time. For example, if the waiting time is shortened during the energy saving control, it is possible to immediately recover the electric power and the other power (i.e., energy level) of the semiconductor manufacturing apparatus to the processable level after stopping the control in progress. Also, if the waiting time becomes long during the energy saving control, it is possible to extend the waiting step in which the energy is kept at a low level or to shift the pattern of the control in progress to a pattern of low energy consumption.

It is preferable that the method further include: obtaining newest information on the waiting time during execution of the energy saving control; obtaining information on a time required for recovery if the electric power and the other power of the semiconductor manufacturing apparatus are immediately recovered to the processable level after stopping the energy saving control in progress.

It is also preferable that the method stated immediately above further include: repeating, in this order, obtaining the newest information on the waiting time, obtaining information on the time required for recovery, and judging whether or not to continue the energy saving control, during execution of the energy saving control of the semiconductor manufacturing apparatus.

In these cases, it is possible to immediately recover the electric power and the other power of the semiconductor manufacturing apparatus to the processable level after stopping the control in progress.

It is preferable that the method further include: obtaining newest information on the waiting time during execution of the energy saving control; obtaining information on a newest required time if a control pattern of the energy saving control in progress is shifted to another control pattern; judging whether or not to shift the pattern of control in progress to the other pattern based on results obtained by comparing the newest waiting time with the newest required time and by estimating an increase or a decrease in the effect of energy saving if the pattern of control in progress is shifted to the other pattern.

It is also preferable that the method stated immediately above further include: repeating, in this order, obtaining the newest information on the waiting time, obtaining the information on the newest required time, and judging whether or not to shift the pattern of control in progress to the other pattern during execution of the energy saving control of the semiconductor manufacturing apparatus.

In these cases, if the waiting time becomes long during the energy saving control, it is possible to shift the pattern of the control to a pattern allowing highly effective energy saving.

It is preferable that the method further include: establishing, as the waiting time, a time shorter than a time logically predicted from an order of processing the product on the production line, a process time for each process of the product, and a position of the product on the production line.

This feature allows stable performance of the energy saving control, since it is possible to completely prevent a trouble such that the product arrives at the manufacturing apparatus before finishing the energy saving control.

According to a second aspect of the invention, a system for controlling a semiconductor manufacturing apparatus in a wait mode includes: a product information obtaining unit that obtains information regarding a waiting time required for a product subjected to a predetermined process by a semiconductor manufacturing apparatus to arrive at the apparatus on a production line; a control information obtaining unit that obtains information regarding a time required to control energy saving between lowering electric power and other energy used by the semiconductor manufacturing apparatus in the wait mode to a level at which the processing is not ready and raising the electric power and the other energy to a processable level at which the product processing is ready; and a judgment unit that judges whether or not to execute the energy saving control of the semiconductor manufacturing apparatus based on results of comparison of the required time with the waiting time and of estimation on an effect of energy saving obtained by executing the energy saving control during the waiting time.

It is preferable that the system further include: a production information management unit that manages information regarding an order of processing the product on the production line, a process time for each process of the product, and a position of the product on the production line; the production information management unit giving information regarding the order of processing, the process time, and the position to the product information obtaining unit which then calculates the waiting time.

The "production information management unit" is composed of, e.g., a computer that manages the production information on various types of products on the production line. The production information may be the information on the order of processing, the process time for each process of the product, and on the position of each product (e.g. lot) on the production line.

According to the second aspect of the invention, the energy saving control may be performed only if the waiting time of the semiconductor manufacturing apparatus in the wait mode is longer than the time required for the energy saving control and if it is estimated that the amount of energy consumption in the wait mode will decrease due to the execution of the energy control during the waiting time. Therefore, the energy loss in the wait mode of the apparatus may be reduced without interfering with the TAT reduction.

BRIEF DESCRIPTION OF THE DRAWINGS

The invention will be described with reference to the accompanying drawings, wherein like numbers reference like elements.

FIG. 2 is a diagram schematically showing an example of a manufacturing apparatus 50a and a PC 60a.

FIG. 3 is a table showing an example of electric power and other energy used by a dry etching apparatus 50a.

FIG. 6 is a flowchart showing how to calculate the shortest arrival time of a product, AT.

DESCRIPTION OF EXEMPLARY EMBODIMENTS

Embodiments of the invention will now be described with reference to the drawings.

Figure 1:
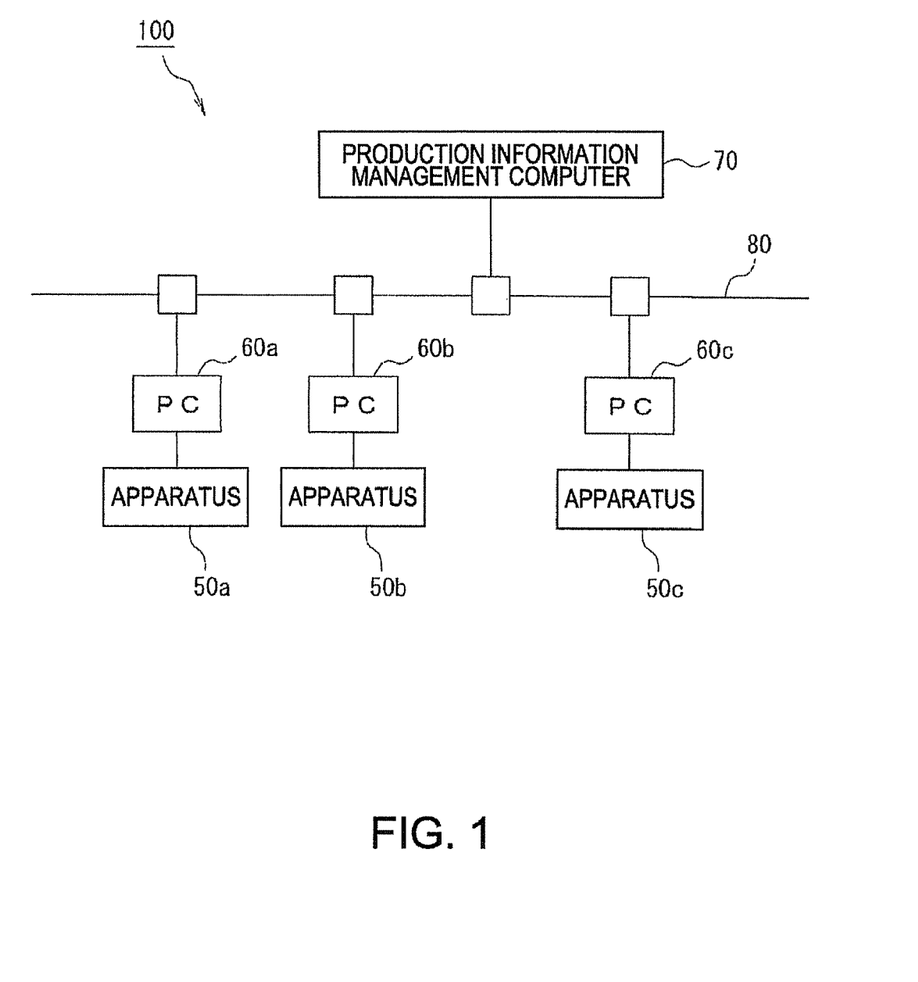
FIG. 1 is a diagram schematically showing an example structure of a control system 100 of a semiconductor manufacturing apparatus according to some embodiments of the invention.

FIG. 1 schematically shows an example structure of a control system 100 of a semiconductor manufacturing apparatus according to the embodiments of the invention.

Referring to FIG. 1, the control system 100 includes: a plurality of semiconductor manufacturing apparatuses (hereunder referred to simply as manufacturing apparatuses) 50a, 50b, 50c, etc. arranged on a semiconductor devices production line, personal computers (hereunder referred to as PC) 60a, 60b, 60c, etc. each arranged corresponding to each of the manufacturing apparatuses 50, for example, a production information management computer 70 that manages production information of the products on the production line, and signal lines 80 that connect the PCs 60a, 60b, 60c, etc. to each other and send/receive data between the production information management computer 70 and the PCs 60a, 60b, 60c, etc.

Examples of the manufacturing apparatuses 50a, 50b, 50c, etc. include a dry etching apparatus, a CVD apparatus, and a thermal treatment apparatus. These manufacturing apparatuses 50a, 50b, 50c, etc. receive energy such as electric power and other energy as their consumption energy. Examples of the product include a semiconductor device formed on a wafer or a glass substrate. The production information management computer 70 includes a computer processing unit (CPU) and a storage unit having, e.g., read only memory (ROM), random access memory (RAM), and hard disks. The production information management computer 70 manages production information such as a through d below.

a. Information on production type
b. Information on order of processing
c. Information on apparatus appropriate for each production type/process
d. Information on time per each production type/process "Information on production type" refers to a type of product on the production line. "Information on order of processing" indicates information on the order of processing a certain product on the production line. The order of processing means an order of processes such as: cleaning→gate oxidation→forming polysilicon film→oxidation→photolithography. The order of processing normally depends on the type of product.

"information on apparatus appropriate for each production type/process" indicates information such that, when using the etching apparatus, a product A may be processed by either an etching apparatus α or an etching apparatus β but a product B can be processed only by the etching apparatus α, for example. Even if the manufacturing apparatuses 50a, 50b, 50c, etc. share the same model number, the performances thereof may vary, and some apparatuses may not be appropriate for certain types of products.

"Information on time per each production type/process" refers to information on time required per each process of a certain product on the production line. It is information on process times, e.g., 40 minutes for cleaning and 3 hours for gate oxidation. Also, certain types of products need different process times. For example, if the thickness of the gate insulation film varies depending on the type of product, the process time thereof may vary even though the same gate oxidation process is conducted. Generally, the thicker the gate insulation film is, the longer the oxidation process takes.

Figure 2:
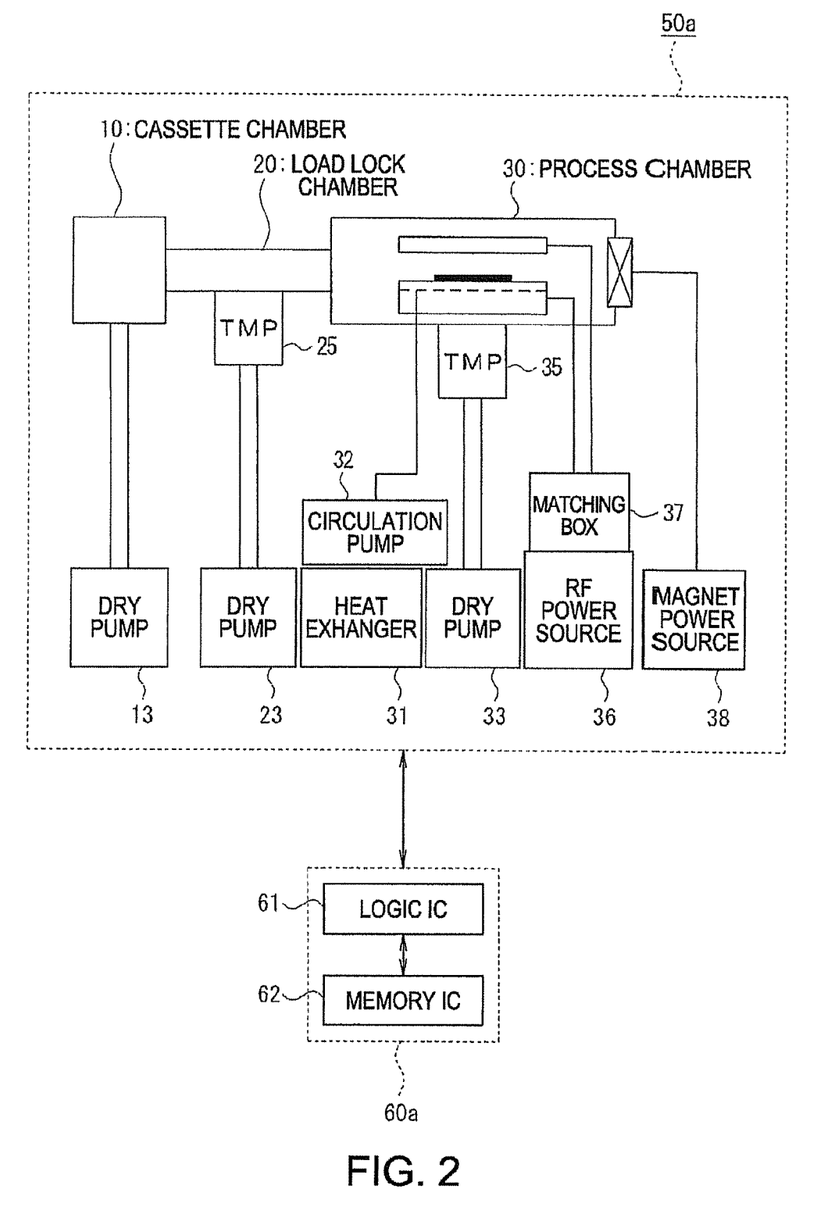

FIG. 2 is a diagram schematically showing an example of the manufacturing apparatus 50a and the PC 60a. Here, a dry etching apparatus is described as one example of the manufacturing apparatus 50a. Referring to FIG. 2, the dry etching apparatus 50a is an apparatus for parallel-plate reactive ion etching (RIE). The dry etching apparatus 50a includes a cassette chamber 10, a load lock chamber 20, a process chamber 30, turbomolecular pumps (TMP) 25 and 35, dry pumps 13, 23, and 33, a heat exchanger 31, a circulation pump 32, a radio-frequency (RF) power source 36, a matching box 37, and a magnetic power source 38.

Referring to FIG. 2, the dry pump 13 evacuates air from the cassette chamber 10. The dry pump 23 and the TMP 25 evacuate air from the load lock chamber 20. The dry pump 33 and the TMP 35 evacuate air from the process chamber 30. Evacuation of air by these pumps helps maintain a predetermined degree of vacuum in the chambers.

The heat exchanger 31 and the circulation pump 32 cool down a stage in the process chamber 30. The circulation pump 32 circulates cooling water to and from the heat exchanger 31 and the stage. The RF power source 36 and the matching box 37 produce plasma in the process chamber 30 with high-frequency discharge. The magnetic power source 38 enhances plasma density on a wafer.

The PC 60a includes a logic integrated circuit (IC) 61 and a memory IC 62. The logic IC 61 handles various types of processing, such as numerical calculation, logic operation, and comparative judgment. The memory IC 62 is composed of e.g. ROM and RAM and stores sequence control programs. Also, the PC 60a is connected by signal lines to the dry pumps 13, 23, and 33, the TMP 25 and 35, the heat exchanger 31, the circulation pump 32, the RF power source 36, the matching box 37, and to the magnetic power source 38. Accordingly, the PC 60a is capable of controlling the operation of the dry etching apparatus 50a that conducts the product process (i.e., etching).

Figure 3:
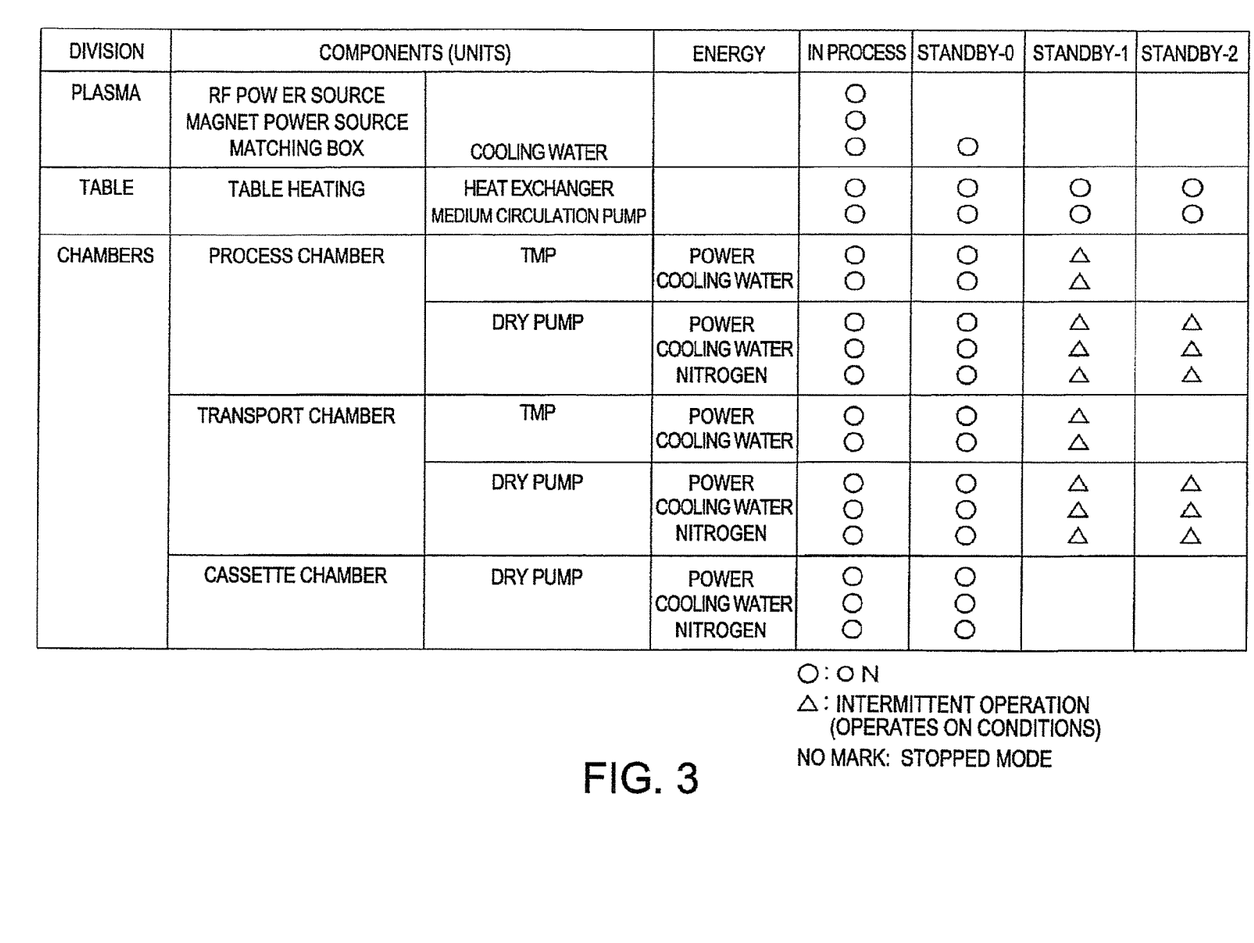

FIG. 3 is a table showing an example of the electric power (supply) and the other energy used by the dry etching apparatus 50a. Here, the other energy refers to energy other than the electric power, such as evacuated air, cooling water, compressed air, vacuum, nitrogen (N$_2$), and released air. As shown in FIG. 3, the dry etching apparatus 50a has various components (units) that consume not only the electrical power but the other energy.

Circles in FIG. 3 indicate that the units are operating, each consuming about the same amount of energy as the energy used in the actual product processing status (i.e., etching). Triangles in the table indicate that the units are intermittently operating, consuming less energy than units with the circles. No mark in the table means the units are stopped.

Referring to FIG. 3, the standby mode of the dry etching apparatus 50a is divided into three modes: standby-0, standby-1, and standby-2. The standby-0 refers to a state at which product processing is ready. At the standby-0, the RF power 36 and the magnet power 38 are stopped, but the other components (units) stay in operation.

The standby-1 and standby-2 refer to a state at which the product processing is not ready because some of the units making up the dry etching apparatus 50a are in a low-energy waiting mode or a stopped mode.

More specifically, at the standby-1, the RF power 36, the magnet power 38, and cooling water of the matching BOX 37 are stopped. Also, the power and cooling water of the TMPs, the power, cooling water, and N$_2$ of the dry pumps are in intermittent operation (intermittent supply). In other words, the apparatus at the standby-1 is in a lower energy wait mode than the standby-0. In contrast, at the standby-2, power and cooling water of the TMPs are also stopped in addition to the standby-1. This means that the apparatuses at the standby-2 are in an even lower energy standby mode than the standby-1.

Accordingly, by providing the energy modes in stages that are lower than the energy mode of the standby-0 at which the product processing is ready, the energy consumption in the standby mode decreases in stages.

Figure 4A:
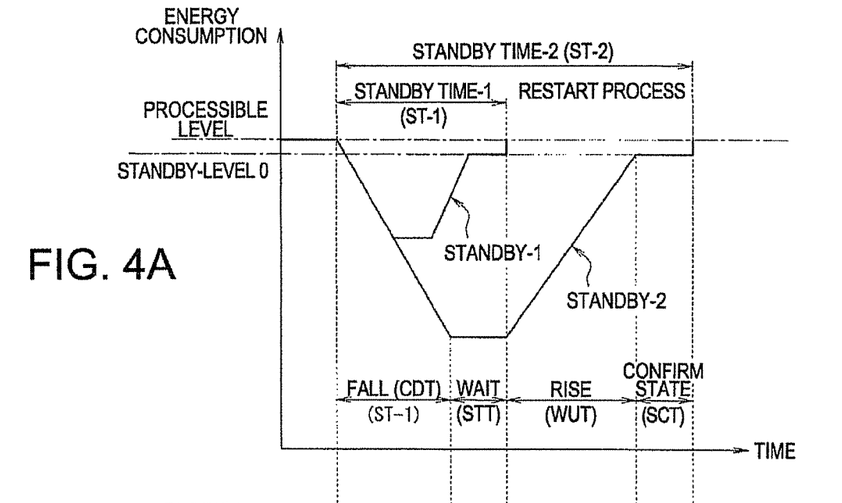
FIG. 4A is a graph showing example patterns of energy saving control.

FIG. 4A is a graph showing example patterns of the energy saving control. Illustrated here are the standby-1 and the standby-2 as the control patterns of the energy saving control. In FIG. 4A, the horizontal axis indicates lapse of time, and the vertical axis indicates amount of energy.

As shown in the FIG. 4A, both control patterns of the standby-1 and standby-2 include four steps: fall (CDT), standby (STT), rise (WUT), and confirm state (SCT).

The fall (CDT) step is a step in which at least some of the units constituting the manufacturing apparatus 50a fall to either the low energy consumption state (i.e., the state with the triangle in FIG. 3) or the stopped state (i.e., the state with no mark in FIG. 3). The wait (STT) step is a step in which at least some of the units constituting the manufacturing apparatus 50a are put in the low energy consumption state or the stopped state in the wait mode. The rise (WUT) step is a step in which the units in the lower energy consumption state or in the stopped state in the wait mode are raised to a state at which the units are ready to start the product processing (i.e., the state with the circle in FIG. 3). The confirm state (SCT) step is a step in which the manufacturing apparatus 50a immediately after the rising is set in the wait mode at the standby-0 for a predetermined period of time so that the unsteadiness of the apparatus (e.g. degree of vacuum in the chamber) due to execution of the energy saving control is eventually eliminated. Also, the confirm state (SCT) step is a step to confirm if there is any problem with the state of the apparatus.

Referring to FIG. 4A, standby time-1 (ST-1) is a total time required for the execution of the standby-1, and is the sum of the times required for the steps of fall (CDT), standby (STT), rise (WUT), and confirm state (SCT). Standby time-2 (ST-2) is the total time required for the execution of the standby-2, and is the sum of the times required for the steps of fall (CDT), standby (STT), rise (WUT), and confirm state (SCT). Referring to FIG. 4A, the lower the amount of energy consumption of the manufacturing apparatus 50a in the wait mode is, the longer the time required for each of the fall (CDT), standby (STT), rise (WUT), and confirm state (SCT) steps becomes. In this embodiment, standby time-1 (ST-1)<standby time-2 (ST-2).

Figure 4B:
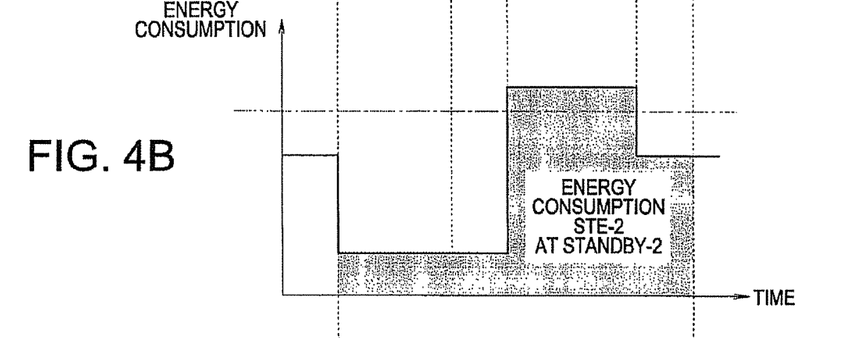
FIGS. 4B and 4C are graphs showing amounts of energy consumption in the energy saving control patterns of FIG. 4A.
Figure 4C:
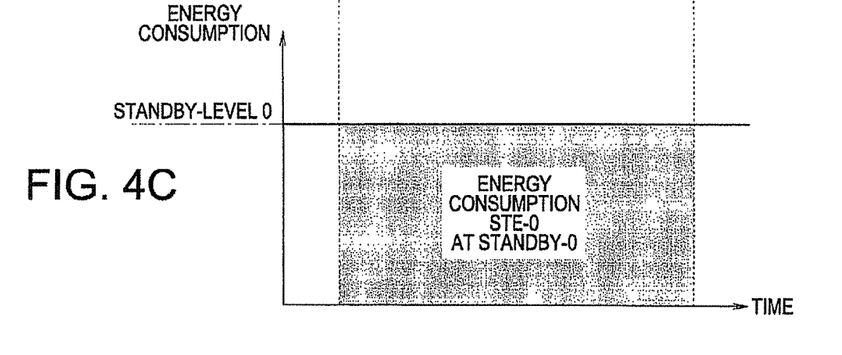

FIG. 4B is a diagram schematically showing an amount of energy consumption (STE-2) when the manufacturing apparatus 50a is set in the wait mode at the standby-2. FIG. 4C is a diagram schematically showing an amount of energy consumption (STE-0) when the manufacturing apparatus 50a is set in the wait mode at the standby-0. In FIGS. 4B and 4C, the horizontal axis indicates lapse of time, and the vertical axis indicates amount of energy.

Referring to FIGS. 4B and 4C, the amount of energy consumption of the manufacturing apparatus 50a in the wait mode is expressed by an area surrounded by the amount of energy on the vertical axis and the standby time on the horizontal axis (i.e., integral of the energy consumption). Compared to the standby-0, the standby-2 consumes less energy at the fall (CDT) and wait (STT) steps but consumes more energy at the rise (WUT) step. Therefore, if the time required for the wait (STT) step is very short at the standby-2, it is possible that the energy consumption at the standby-2 becomes larger than that at the standby-O. Similarly, if the time required for the waiting (STT) step is very short at the standby-1, it is possible that the energy consumption at the standby-1 becomes larger than that at the standby-0.

Because of these possibilities, in this embodiment, the waiting time (STT) of each of the standby-1 and standby-2 is set equal to or longer than a predetermined time so that more energy is saved by the execution of the standby-1 and standby-2. At the standby-1 and standby-2, the longer the time required for the waiting (STT) step is, the less the energy consumption is when compared with the standby-0.

Figure 5:
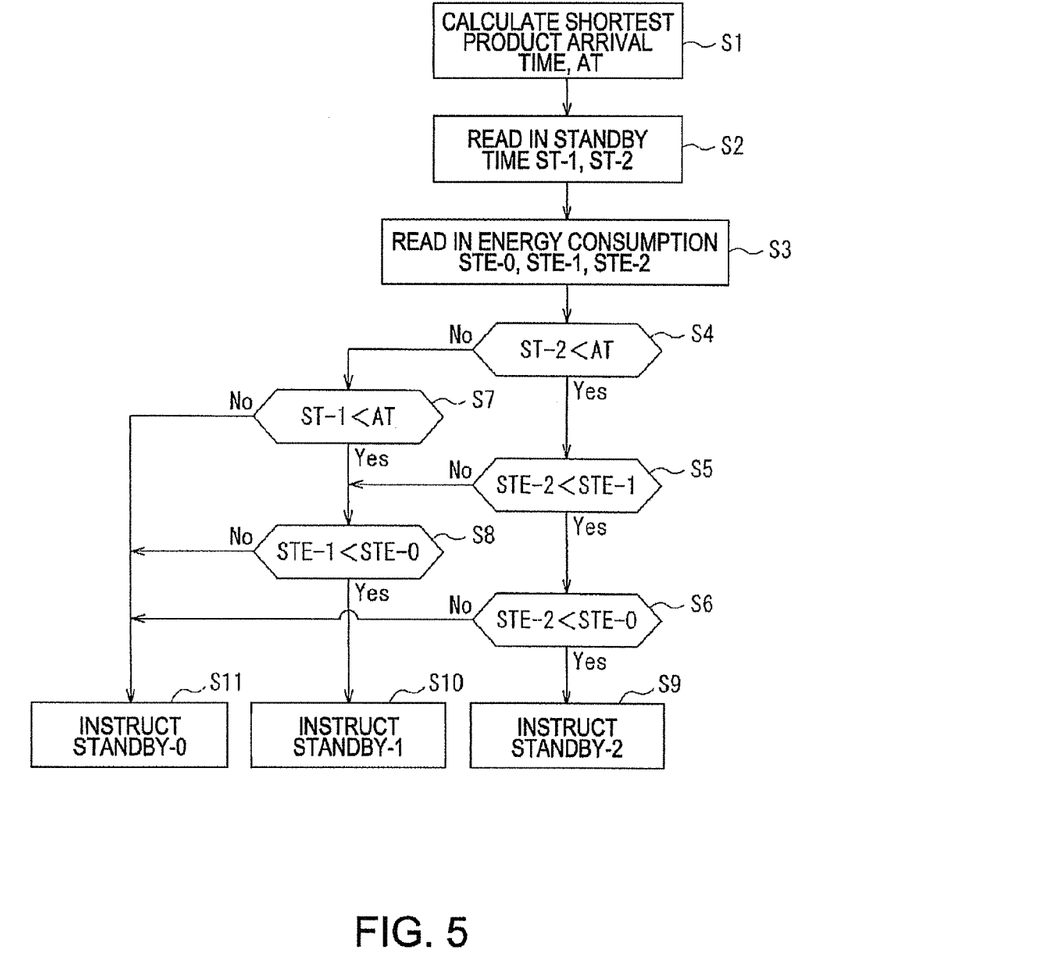
FIG. 5 is a flowchart showing how to select energy saving control patterns.

FIG. 5 is a flowchart showing how to select the control patterns of the energy saving control. First, after the manufacturing apparatus 50a finishes the product processing, a shortest product arrival time AT is calculated using the apparatus 50a (Step S1). A method for calculating AT in Step S1 is explained with reference to FIG. 6.

Figure 6:
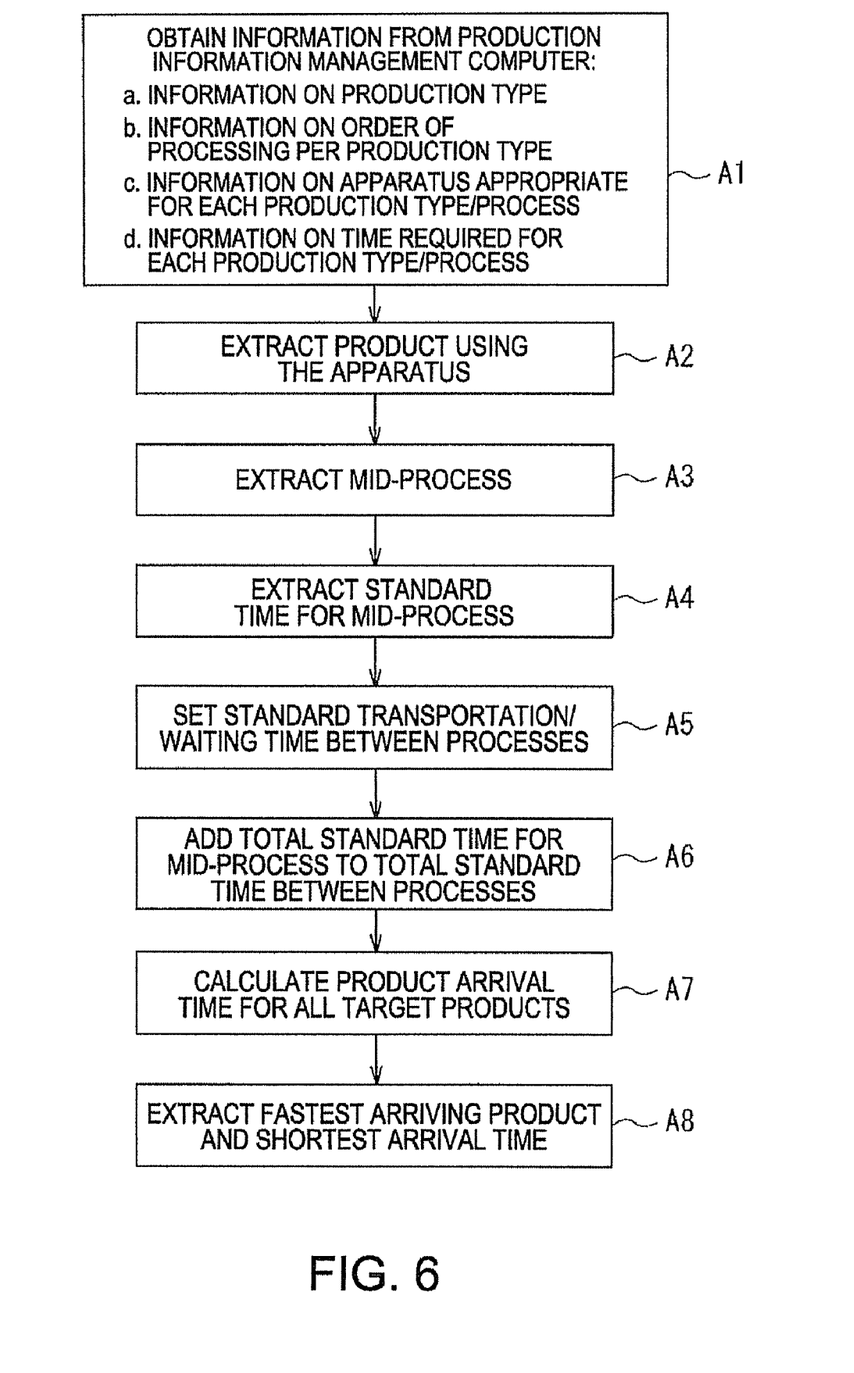

FIG. 6 is a flowchart showing how to calculate the shortest product arrival time AT.

First, in Step A1, the PC 60a obtains the aforementioned production information a through d from the production information management computer 70. Then, in Step A2, the PC 60a extracts a product to be processed by the manufacturing apparatus 50a out of the products now on the production line or soon to be put on the production line. For example, if the types of the products on the production line are products A through Z, and if the products A and B out of these products are the only types of products to be processed using the dry etching apparatus 50a, then the PC 60a extracts the products A and B based on the production information a through c.

Then, in Step A3, the PC 60a extracts mid-processes of the products A and B. The mid-process of the product A is a process between when the product A is put on the production line and when the product A is processed by the manufacturing apparatus 50a. The mid-process of the product B is a process between when the product B is put on the production line and when the product B is processed by the manufacturing apparatus 50a. The PC 60a conducts this extraction in Step A3 based on the production information b and c, for example.

Figure 7:
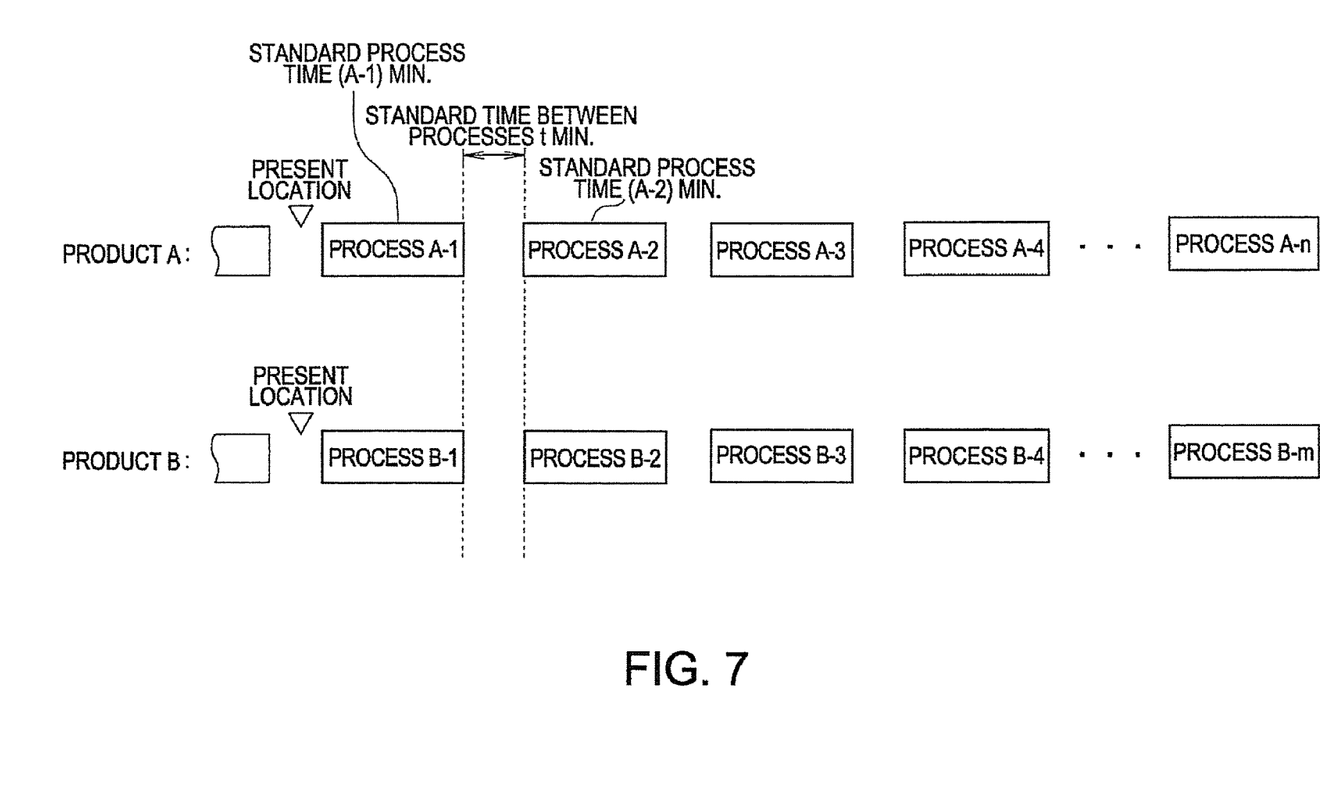
FIG. 7 is a diagram showing standard process times and standard times between processes.

Thereafter, in Step A4, a standard process time-i in the mid-process is extracted per each type of product (i.e., per production type). For example, as illustrated in FIG. 7, the product A undergoes the product processes from A-1 to A-n (n is an integer larger than 5) using the manufacturing apparatus 50a. In this case, as in Step A4, each of the standard process times is extracted for each process of the product A. For example, the standard process time of the process A-1 is (A-1) minutes, and the standard process time of the process A-2 is (A-2) minutes. Since the manufacturing apparatus 50a also processes the product B in Step A4, the standard process time of each of the mid-processes is extracted also for the product B. The PC 60a conducts this extraction in Step A4 based on the production information b, c, and d, for example.

Then, Step A5 establishes standard times required to transport products between the processes and to wait for the next processes. Referring to FIG. 7, the standard times required to transport the products between the processes and to wait for the next processes are each established as t. In an actual production line, it is common that one transportation time between processes defers from the other depending on the layout of the apparatuses. Therefore, each transporting and waiting standard time may be established for each period of time between processes. In other words, the period of time between processes may be established in accordance with differences in the course of the processing, e.g., the layout of the units and the period of time between processes.

For example, suppose that the standard transporting and waiting time between the processes A-2 and A-3 is t23 minutes, and the standard transporting and waiting time between the processes A-3 and A-4 is t34 minutes. In this case, if apparatuses used in Step A-2 and Step A-3 are arranged apart from each other, and apparatuses used in Steps A-3 and A-4 are arranged close to each other, t34 is generally less than t23. The values of t23 and t34 may be taken from the averages obtained by recording the actual times required to transport and wait between the processes.

Then, in Step 6A, the sum of the total standard process time for the mid-processes and the total standard time between processes is calculated for each type of product. The total standard process time is calculated using Formula 1, and the total standard time between processes is calculated using Formula 2. The PC 60a conducts these calculations, for example.

$$\text{Total Standard Process Time} = \sum_{i=1}^{N} (\text{Standard Time-}i) \quad \text{Formula 1}$$

$$\text{Total Standard Time between Processes} = (N+1) \times \text{Standard Time between Processes} \quad \text{Formula 2}$$

In the formulas 1 and 2, N indicates the number of mid-processes between the present location and the manufacturing apparatus 50a that either a product A or a product B is subjected.

Next, in Step 7A, a product arrival time per each of the products A and B to be processed using the manufacturing apparatus 50a is calculated. The product arrival times may be calculated using Formula 3. The PC conducts these calculations, for example.

$$\text{Waiting Time for Product Processing} = \text{Total Standard Process Time} + \text{Total Time between Processes} \quad \text{Formula 3}$$

In Step 8A, a product with the shortest arrival time is identified based on the results of calculations in Step 7A. The arrival time of the identified product is the shortest product arrival time AT.

Referring back to FIG. 5, in Step S2, the PC 60a reads in the standby times, ST-1 and ST-2, of the manufacturing apparatus 50a. As shown in FIG. 4A, ST-1<ST-2 in the embodiment. Then, in Step S3, the PC 60a reads in: the energy consumption STE-0 when the manufacturing apparatus 50a is set in the wait mode at the standby-0, the energy consumption STE-1 when the apparatus is set in the wait mode at the standby-1, and the energy consumption STE-2 when the apparatus is set in the wait mode at the standby-2.

In Step 4, the shortest product arrival time AT is compared with the total time required ST-2 of the standby-2 of the manufacturing apparatus 50a. If AT is longer than ST-2 (i.e., if ST-2<AT), the process proceeds to Step 5. If ST-2≧AT, the process proceeds to Step 7. The PC 60a compares ST-2 with AT and judges on which is larger or smaller.

In Step 5, the energy consumption STE-2 when the manufacturing apparatus 50a is set in the wait mode at the standby-2 is compared with the energy consumption STE-1 when the apparatus 50a is set in the wait mode at the standby-1. If STE-2 is larger than STE-1 (i.e., when STE-2<STE-1), the process proceeds to Step S6. If STE-2≧STE-1, the process proceeds to Step S8. The PC 60a compares STE-2 with STE-1 and judges on which is larger or smaller.

In Step 6, the PC 60a compares the energy consumption STE-2 when the manufacturing apparatus 50a is set in the wait mode at the standby-2 with the energy consumption STE-0 when the apparatus 50a is set in the wait mode at the standby-0. If STE-0 is larger than STE-2 (i.e., when STE-2<STE-0), the process proceeds to Step S9, and the PC 60a instructs the apparatus 50a to execute the standby-2. If STE-2≧STE-0, the process proceeds to Step S11, and the PC 60a instructs the apparatus 50a to execute the standby-O.

In Step 7, the shortest product arrival time AT is compared with the total time required ST-1 by the manufacturing apparatus 50a at the standby-1. If AT is longer than ST-1 (i.e., if ST-1<AT), the process proceeds to Step 8. If ST-1≧AT, the process proceeds to Step 11. The PC 60a compares ST-1 with AT and judges on which is larger or smaller.

In Step 8, the energy consumption STE-1 when the apparatus 50*a* is set in the wait mode at the standby-1 is compared with the energy consumption STE-0 when the apparatus 50*a* is set in the wait mode at the standby-0. If STE-0 is larger than STE-1 (i.e., when STE-1<STE-0), the process proceeds to Step 10, and the PC 60*a* instructs the manufacturing apparatus 50*a* to execute the standby-1. If STE-1≧STE-0, the process proceeds to Step S11.

As has been described, according to the embodiments of the invention, the energy saving control may be executed only if the waiting time of the manufacturing apparatuses 50*a*, 50*b*, 50*c*, etc. in the wait mode is longer than the time required for the energy saving control, and if the energy consumption in the wait mode is estimated to decrease due to the execution of the energy saving control during the waiting time. Therefore, it is possible to reduce the energy loss in the wait mode of the manufacturing apparatuses 50*a*, 50*b*, 50*c*, etc. without interfering with the TAT reduction.

Figure 8:
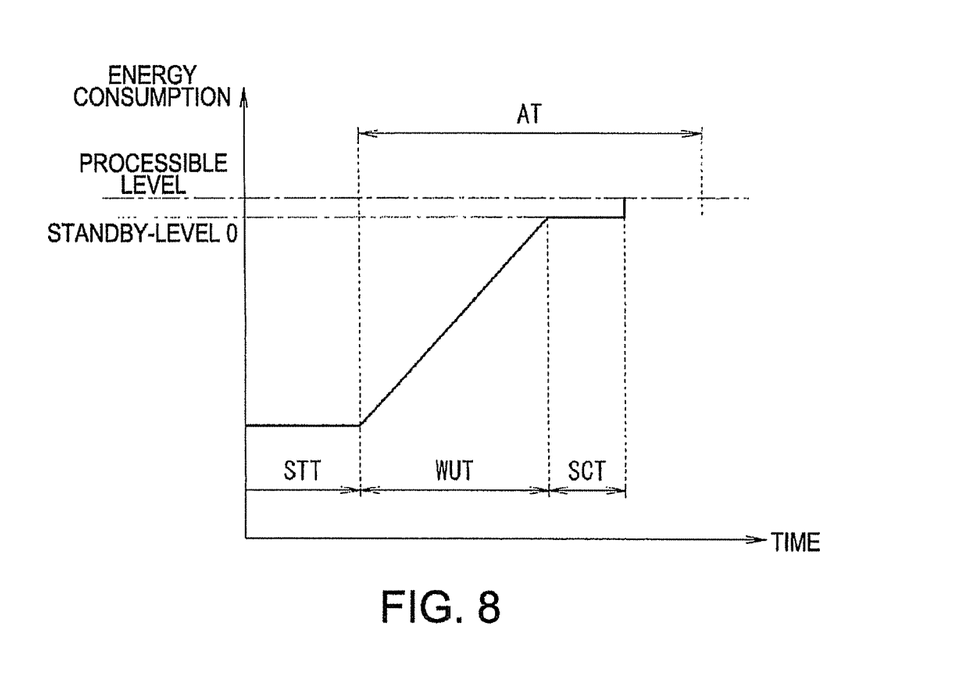
FIG. 8 is a diagram showing an example pattern of the control at rising.

In the embodiments of the invention, the wait (STT) step may be maintained even after the instruction for standby-1 or standby-2 is given, until when the shortest time to wait for product processing AT is retrieved (i.e., the newest AT is obtained) and until when the new AT becomes equal to the sum of the rise (WUT) time and the confirm state (SCT) time. In other words, it is possible to keep extending the wait (STT) time and to repeatedly calculate the shortest time to wait for product processing AT even during the energy saving control so long as AT≧WUT+SCT is satisfied as illustrated in FIG. 8.

Figure 9:
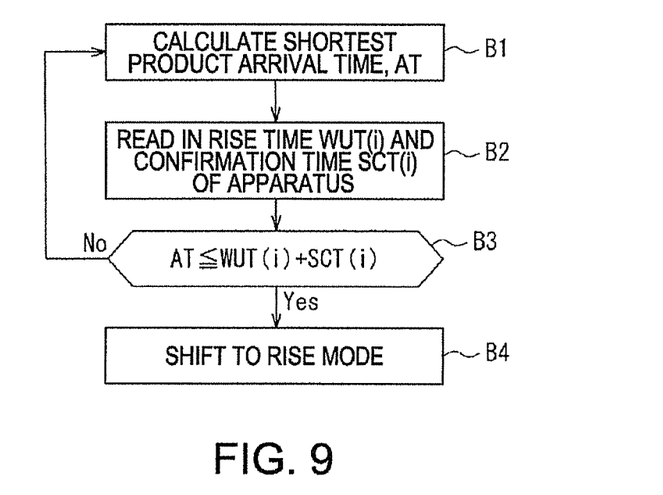
FIG. 9 is a flowchart showing how to extend the energy saving control.

FIG. 9 is a flowchart showing how to extend the energy saving control. First, in Step B1, the shortest product arrival time AT of the product to be processed next is calculated. The calculation of the AT in this Step B is the same as that in Step S1 in FIG. 5. Then, in Step B2, the PC 60*a* reads in the rising time WUT(i) and the confirm state time SCT(i) of the apparatus in the standby state during the execution. Here, i is an integer indicating the type of control pattern. For example, if the standby-2 is being executed, the PC 60*a* reads in the time WUT(2) required to raise the manufacturing apparatus 50*a* and the time SCT(2) to confirm the apparatus.

Then, in Step B3, the PC 60*a* compares the shortest product arrival time AT with the sum of the rise time WUT(i) and the confirm time SCT(i). If AT≦WUT(i)+SCT(i), the process proceeds to Step B4 and starts the rise (WUT) step. If AT>WUT(i)+SCT(i), the process goes back to Step B1 and re-calculates the shortest arrival time AT while maintaining the wait (STT) step. This means that the steps B1 through B3 are repeated while maintaining the wait (STT) step until AT≦WUT(i)+SCT(i) is satisfied.

According to the embodiments of the invention, it is possible to flexibly response to fluctuations of the wait time. Specifically, if the waiting time is shortened during the energy saving control, the control may be stopped in the middle of the control, and the required amount of the electric power and the other energy (i.e., energy level) may be immediately recovered to the level at which processing is ready. Also, if the wait time is extended during the energy saving control, the wait (STT) step in which the energy is maintained at low level may be extended.

Figure 10:
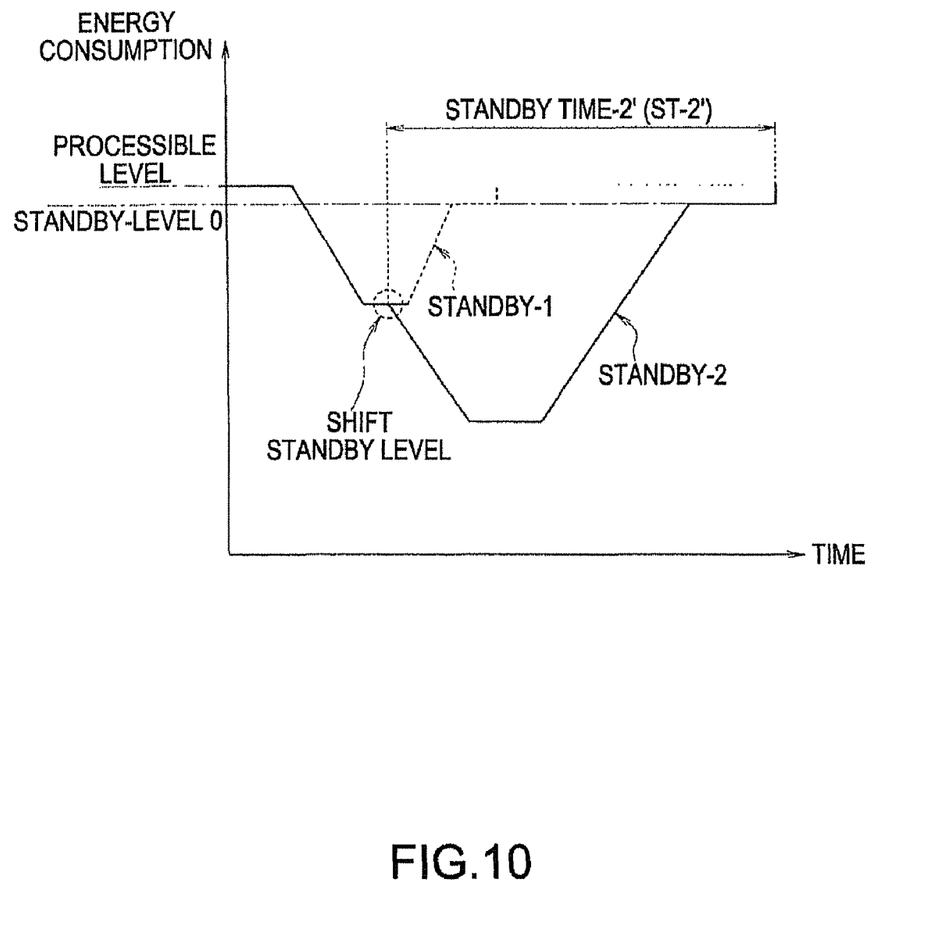
FIG. 10 is a diagram showing an example of a pattern shift during the control.

Moreover, in the embodiments of the invention, if the wait time is extended during the energy saving control, the control pattern may be shifted to another pattern that allows more effective energy saving. For example, as shown in FIG. 10, the PC 60*a* retrieves (re-obtains) the shortest product arrival time AT (i.e., the newest AT is obtained) and calculates the time ST-2' required for the energy saving control if the standby-1 is shifted to the standby-2 at the time of retrieval of AT. Also, the PC 60*a* calculates the effect of the energy saving (i.e. increase and decrease in the amount of energy consumption) that is expected if the standby-1 is shifted to the standby-2 at the time of retrieval of AT.

Then, if AT≧ST'2, and if the PC 60*a* judges that the energy consumption is reduced because the standby-1 is shifted to the standby-2, the standby level is shifted from the standby-1 to the standby-2 as shown in FIG. 10.

According to the embodiments of the invention, because a control pattern may be shifted to another pattern that allows more effective energy saving if the wait time is extended during the energy saving control, it is possible to flexibly response to fluctuations of the wait time. Since the shortest product arrival time AT often fluctuates due to troubles in the production line or to revisions of the production plans, it is preferable that the PC 60*a* repeat such readjustments of the standby levels.

Also, according to the embodiments of the invention, the shortest product arrival time AT does not necessarily be precisely determined. If it is discovered that the product process waiting time continues as long as or longer than the time required to reduce the energy consumption per each apparatus (e.g., if it is discovered that a product will not arrive at least another six hours), the steps as in the flowcharts of FIG. 5 or FIG. 9 may be executed based on the estimated hours.

Moreover, in the embodiments, the shortest product arrival time AT may be established as a time (i.e., a time at which the product never arrives at the manufacturing apparatus) shorter than the time that is logically predicted from: the order of product processing on the production line, the process time required to process this product per each process, and the position of the product on the production line. For example, using Formula 3, the total time between processes may be assumed as 0. Then, the product process waiting time becomes equal to the total standard process time.

This feature allows stable performance of the energy saving control, since it is possible to completely prevent such troubles as that the product reaches the manufacturing apparatus 50*a* before finishing the energy saving control.

In the embodiments, the PC 60*a* (or PC 60*b*, or PC 60*c*) corresponds to the "production information obtaining unit," the "control information obtaining unit," and the "judgment unit" of some embodiments of the invention. Also, the production information control computer 70 corresponds to the "production information control unit" of some embodiments of the invention.

The entire disclosure of Japanese Patent Application No. 2006-101696, filed Apr. 3, 2006 is expressly incorporated by reference herein.

What is claimed is:

1. A method for controlling a semiconductor manufacturing apparatus in a wait mode, comprising:

obtaining information regarding a waiting time required for a product to arrive at the apparatus on a production line, the product being subjected to a predetermined semiconductor manufacturing process;

obtaining information regarding a time required to control energy saving between lowering electric power used by the semiconductor manufacturing apparatus in the wait mode to a level at which the processing is not ready and raising the electric power to a processable level at which the product processing is ready; and judging whether or not to execute the energy saving control of the semiconductor manufacturing apparatus based on results of comparison of the required time with the waiting time and of estimation on an effect of energy saving obtained by executing the energy saving control during the waiting time.

2. The method for controlling a semiconductor manufacturing apparatus according to claim 1, the judgment on whether or not to execute the energy saving including:
  executing the energy saving control if the required time is shorter than the waiting time and if it is estimated that an amount of energy consumption in a wait mode will decrease due to the execution of the energy control during the waiting time; and
  not executing the energy saving control if the required time is equal to or longer than the waiting time or if it is estimated that an amount of energy consumption in a wait mode will not decrease due to the execution of the energy control during the waiting time.

3. The method for controlling a semiconductor manufacturing apparatus according to claim 1, the energy saving control including:
  lowering the electric power used by the semiconductor manufacturing apparatus in the wait mode to a low energy level;
  maintaining the electric power in the wait mode at the low energy level for a predetermined period of time;
  raising the electric power from the low energy level to the processable level; and
  confirming a state of the semiconductor manufacturing apparatus after raising the level of the electric power in the wait mode to the processable level.

4. The method for controlling a semiconductor manufacturing apparatus according to claim 1, further comprising:
  having several types of control patterns to be selected, each having a different required time and a different amount of energy consumption;
  the judgment on whether or not to execute the energy saving control including:
  comparing the waiting time and the required time for each of the several types of control patterns;
  estimating the effect of energy saving using a first specific pattern selected out of the several types of patterns, the first specific pattern being an only one pattern in which the required time is shorter than the waiting time; and
  estimating the effect of energy saving using a second specific pattern selected out of two or more specific patterns in which the required time is shorter than the waiting time, the second specific pattern being a most energy-saving pattern in the two or more specific patterns out of the several types of patterns.

5. The method for controlling a semiconductor manufacturing apparatus according to claim 1, further comprising:
  obtaining information on a newest waiting time during execution of the energy saving control; and
  readjust a control pattern of the energy saving control in progress based on the information on the newest waiting time.

6. The method for controlling a semiconductor manufacturing apparatus according to claim 1, further comprising:
  obtaining newest information on the waiting time during execution of the energy saving control;
  obtaining information on a time required for recovery if the electric power of the semiconductor manufacturing apparatus are immediately recovered to the processable level after stopping the energy saving control in progress.

7. The method for controlling a semiconductor manufacturing apparatus according to claim 6, further comprising:
  repeating, in this order, obtaining the newest information on the waiting time, obtaining information on the time required for recovery, and judging whether or not to continue the energy saving control, during execution of the energy saving control of the semiconductor manufacturing apparatus.

8. The method for controlling a semiconductor manufacturing apparatus according to claim 1, further comprising:
  obtaining newest information on the waiting time during execution of the energy saving control;
  obtaining information on a newest required time if a control pattern of the energy saving control in progress is shifted to another control pattern;
  judging whether or not to shift the pattern of control in progress to the other pattern based on results obtained by comparing the newest waiting time with the newest required time and by estimating an increase or a decrease in the effect of energy saving if the pattern of control in progress is shifted to the other pattern.

9. The method for controlling a semiconductor manufacturing apparatus according to claim 8, further comprising:
  repeating, in this order, obtaining the newest information on the waiting time, obtaining the information on the newest required time, and judging whether or not to shift the pattern of control in progress to the other pattern during execution of the energy saving control of the semiconductor manufacturing apparatus.

10. The method for controlling a semiconductor manufacturing apparatus according to claim 1, further comprising:
  establishing, as the waiting time, a time shorter than a time logically predicted from an order of processing the product on the production line, a process time for each process of the product, and a position of the product on the production line.

11. A system for controlling a semiconductor manufacturing apparatus in a wait mode, comprising:
  a product information obtaining unit that obtains information regarding a waiting time required for a product subjected to a predetermined process by a semiconductor manufacturing apparatus to arrive at the apparatus on a production line;
  a control information obtaining unit that obtains information regarding a time required to control energy saving between lowering electric power used by the semiconductor manufacturing apparatus in the wait mode to a level at which a processing is not ready and raising the electric power to a processable level at which the product processing is ready; and
  a judgment unit that judges whether or not to execute the energy saving control of the semiconductor manufacturing apparatus based on results of comparison of the required time with the waiting time and of estimation on an effect of energy saving obtained by executing the energy saving control during the waiting time.

12. The system for controlling a semiconductor manufacturing apparatus according to claim 11, further comprising:
  a production information management unit that manages information regarding an order of processing the product on the production line, a process time for each process of the product, and a position of the product on the production line;
  the production information management unit giving information regarding the order of processing, the process time, and the position to the product information obtaining unit which then calculates the waiting time.

* * * * *